United States Patent [19]

Ogawa

[11] Patent Number: 5,295,254
[45] Date of Patent: Mar. 15, 1994

[54] SEMICONDUCTOR MEMORY DEVICE CELL ARRAY DIVIDED INTO A PLURALITY OF BLOCKS

[75] Inventor: Yoshinori Ogawa, Tokyo, Japan

[73] Assignee: Kabushiki Kaisha Toshiba, Kawasaki, Japan

[21] Appl. No.: 767,898

[22] Filed: Sep. 30, 1991

[30] Foreign Application Priority Data

Sep. 29, 1990 [JP] Japan .................. 2-260718

[51] Int. Cl.⁵ .............................. G06F 12/06
[52] U.S. Cl. ..................... 395/425; 365/189.05; 365/222; 365/230.03; 365/230.04
[58] Field of Search ............... 395/425; 365/230.03, 365/230.04, 222, 189.05

[56] References Cited

U.S. PATENT DOCUMENTS

| | | | |
|---|---|---|---|
| 4,825,411 | 4/1989 | Hamano | 365/219 |
| 4,855,959 | 8/1989 | Kobayashi | 365/239 |
| 4,947,373 | 8/1990 | Yamaguchi et al. | 365/189.04 |
| 5,121,360 | 6/1992 | West et al. | 365/230.03 |
| 5,179,372 | 1/1993 | West et al. | 340/799 |
| 5,208,775 | 5/1993 | Lee | 365/200 |

FOREIGN PATENT DOCUMENTS 0178922 4/1986 European Pat. Off. .
0326172 8/1989 European Pat. Off. .
WO91/17544 11/1991 World Int. Prop. O. .

Primary Examiner—Joseph L. Dixon
Assistant Examiner—B. James Peikari
Attorney, Agent, or Firm—Foley & Lardner

[57] ABSTRACT

There is disclosed a semiconductor memory device as a multi-port DRAM having split SAM registers. This memory device comprises a RAM section of which memory area is halved into first and second cell arrays by the value of a specific bit constituting a portion of a column address, a SAM section comprised of first and second registers, first and second data transfer paths for carrying out data transfer from the first and second cell arrays to the first and second registers, respectively, third and fourth data transfer paths for shifting data from the first and second cell arrays to the second and first data transfer paths, respectively, and first, second third and fourth transfer controllers are inserted into the first, second third and fourth data transfer paths, respectively. Thus, with this multi-port DRAM, the degree of freedom of mapping is improved in a frame buffer.

6 Claims, 5 Drawing Sheets

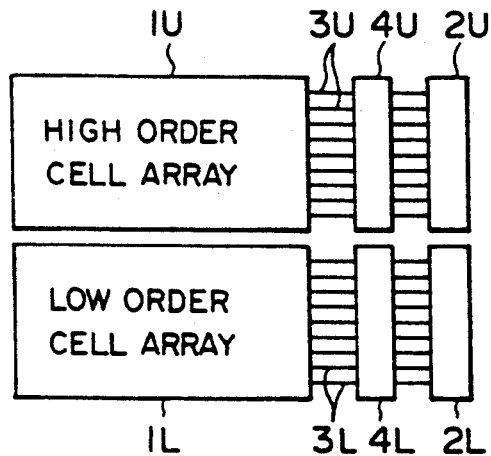
FIG. I PRIOR ART
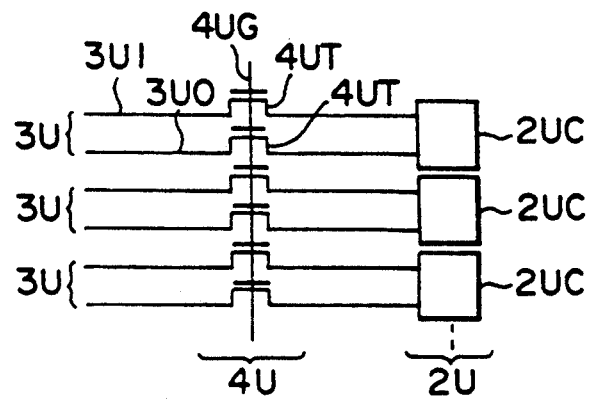
FIG. 2A PRIOR ART
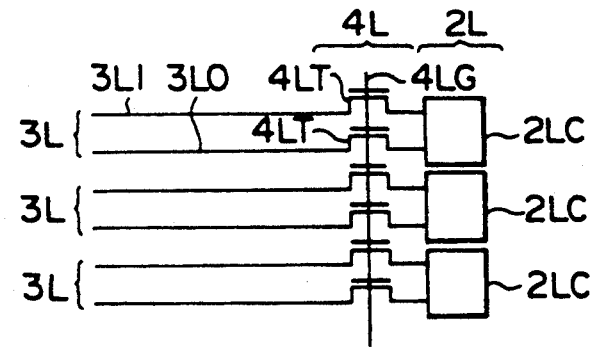
FIG. 2B PRIOR ART

SEMICONDUCTOR MEMORY DEVICE CELL ARRAY DIVIDED INTO A PLURALITY OF BLOCKS

BACKGROUND OF THE INVENTION

This invention relates to a semiconductor memory device as a multi-port DRAM having split SAM registers.

An example of the conventional DRAM of this kind is shown in FIG. 1. As seen from this figure, the cell array constituting the RAM section is divided into a cell array where the value of the Most Significant Bit (MSB) value in the column address is "1" (hereinafter referred to as a high order cell array 1U) and a cell array where the value of the MSB is "0" (hereinafter referred to as a low order cell array 1L), and includes high order and low order SAM registers 2U and 2L in correspondence with the respective cell arrays 1U and 1L. Reference numeral 3U represents bit line pairs constituting data transfer paths between the high order cell array 1U and the high order SAM register 2U, and reference numeral 3L represents bit line pairs constituting data transfer paths between the low order cell array 1L and the low order SAM register 2L. In addition, transfer gates 4U and 4L are inserted into the bit line pairs 3U and the bit line pairs 3L, respectively.

The details of the relationship of the transfer gate 4U, the bit line pairs 3U and the high order SAM register 2U and the relationship of the transfer gate 4L, the line pairs 3L and the low order SAM register 2L are shown in FIGS. 2A and 2B, respectively.

In FIG. 2A, reference numeral 2UC represents cells constituting the high order SAM register 2U, and reference numerals 3U1 and 3U0 represent bit lines constituting respective bit line pairs 3U. The transfer gate 4U is comprised of a plurality of transistors 4UT. In addition, transistors 4UT are respectively inserted into bit lines 3U1 and 3U0 constituting respective bit pairs. Similarly, in FIG. 2B, reference numeral 2LC represents cells constituting the low order SAM register 2L, and reference numerals 3L1 and 3L0 represent bit lines constituting respective bit line pairs 3L. The transfer gate 4L is comprised of a plurality of transistors 4LT. In addition, transistors 4LT are respectively inserted into bit lines 3L1 and 3L0 constituting respective bit pairs.

In the above-mentioned configuration, by respectively allowing the transistors 4UT and 4LT to be turned ON and OFF, only the bit line pairs 3U on the high order side become active, resulting in the state where data transfer from the high order cell array 1U only to the high order SAM register 2U can be carried out. In contrast, by respectively allowing the transistors 4UT and 4LT to be turned OFF and ON, only the bit line pairs 3L on the low order side become active, resulting in the state where data transfer from the low order cell array 1L only the low order SAM register 2L can be carried out. Accordingly, by alternately placing both registers 2U and 2L on the high order and low order sides in a standby state and in an operational state to carry out the split transfer, continuous access from the SAM side can be provided.

As stated above, by employing a configuration in which the RAM section cell array is halved by the value of MSB of the column address and SAM registers are provided in correspondence with respective cell arrays, split transfer is performed every ½ row, permitting random access every ½ row from the SAM side. Thus, so-called window control can be efficiently carried out.

Namely, FIG. 3 represents a memory space of the RAM section and FIG. 4 represents a display image subjected to mapping in correspondence with the memory space. In these figures, each rectangular region indicates one word, and the figure in the word indicates an address number It is to be noted that when a specific word is designated, a notation is employed in the following description such that alphabetical symbol "AD" is attached before the address number. For example, in the case of the word of the address number "1", that word will be called "word AD1".

Let as now consider the case where a window is set in FIG. 4 in the region extending over the words AD6, AD7, AD10, AD11, AD14 and AD15 to control the window thus set.

Initially, in the case of an access every row, in order to make an access to the region extending over the words AD6, AD7, AD10, AD11, AD14 and AD15, the region including the words AD5, AD8, AD9, AD12, AD13 and AD16 must be accessed, resulting in redundant bits of at least one byte, which are useless for the window control.

On the contrary, if an access every ½ row can be made, it is not required to make an access to the region including the words AD5, AD8, AD9, AD12, AD13 and AD16. It is sufficient only to access the region including the words AD6, AD7, AD10, AD11, AD14 and AD15. As a result, the efficiency is improved.

However, in a conventional multi-port DRAM having split registers, there is the problem that when a frame buffer is constructed, mapping on a display image is restricted. Namely, in the case of FIG. 4, by interchangeably making accesses to the SAM registers 2U and 2L on the respective high order and low order sides, continuous access with respect to the words AD6, AD7, AD10, AD11, AD14 and AD15 can be provided.

On the other hand, FIG. 5 shows a display image subjected to mapping in another form. Let now consider the case where the control of a window set in the region extending over the words AD4, AD5, AD7, AD8, AD10 and AD11 is carried out.

In the case of carrying out a continuous split transfer, accesses to the SAM registers 2U and 2L on the respective high order and low order sides are necessarily made. However, in the case of mapping shown in FIG. 5, if such a split transfer is used, since continuous words AD5 and AD7 and continuous words AD8 and AD10 belong to the same cell array 1U or 1L, it is inevitable for maintaining continuity of those words to transfer words AD6 and AD9 to the registers 2U and 2L even if no readout operation is carried out from the registers 2U and 2L. For this reason, such a mapping as shown in FIG. 5 cannot be carried out.

As stated above, in the conventional multi-port DRAM, mapping is disadvantageously restricted in constituting a frame buffer.

SUMMARY OF THE INVENTION

Accordingly, an object of this invention is to provide a semiconductor memory device capable of making continuous accesses to the same cell in the RAM section where the cell array is divided into a plurality of blocks, and capable of improving the degree of freedom of mapping in constituting a frame buffer.

To achieve the above-mentioned object in accordance with this invention, there is provided a semiconductor device comprising a first data transfer path for carrying out data transfer from a first cell array of a RAM section to a first register of the SAM section, a first transfer control means inserted in the first data transfer path, a second data transfer path for carrying out data transfer from a second cell array of the RAM section to a second register of the SAM section, a second transfer control inserted in the second data transfer path, a third data transfer path for shifting data from the first cell array to the second data transfer path, a third transfer control means inserted in the third data transfer path, a fourth data transfer path for shifting data from the second cell array to the first data transfer path, and a fourth transfer control means inserted in the fourth data transfer path to carry out the control of the first to fourth transfer gates, thereby permitting data transfer to a register on the standby side of the first and second registers constituting the SAM section to be carried out at all times irrespective of the value of a specific bit of the column address. For this reason, continuous access by the split transfer within the same cell array can be made. Thus, the degree of freedom of mapping can be improved in constituting a frame buffer.

BRIEF DESCRIPTION OF THE DRAWINGS

In the accompanying drawings:
FIG. 1 is a block diagram of a prior art,
FIGS. 2A and 2B are circuit diagrams showing the detail of the transfer gate section of the prior art.

DESCRIPTION OF THE PREFERRED EMBODIMENTS

Figure 6:
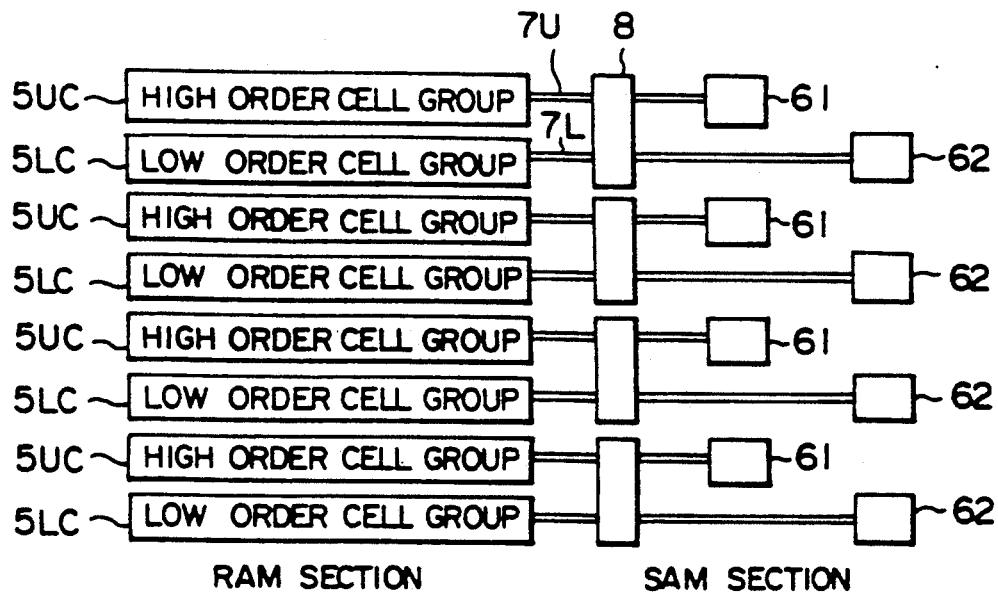
FIG. 6 is a block gram of a first embodiment of this invention.

Preferred embodiments of this invention will now be described with reference to the attached drawings.
Initially referring to FIG. 6, there is shown in block form a semiconductor device according to a first embodiment of this invention.
In this figure, the RAM section cell array is divided into a high order cell array where value of the MSB in the column address is "1" and a low order cell array where that value is "0", Reference numeral 5UC represents cell groups constituting the high order cell array and reference numeral 5LC represents cell groups constituting the low order cell array.
In correspondence with the division of the RAM section, the SAM section is similarly halved into split SAM registers, wherein reference numerals 61 and 62 represent cell groups constituting the split SAM registers, respectively. Further, reference numeral 7U represents bit line groups constituting data transfer paths between the cell groups 5UC of the high order cell array and the SAM register cell groups 61, and reference numeral 7L represents bit line groups constituting data transfer paths between the cell groups 5LC of the high order cell array and the SAM register cell groups 62.

Figure 7:
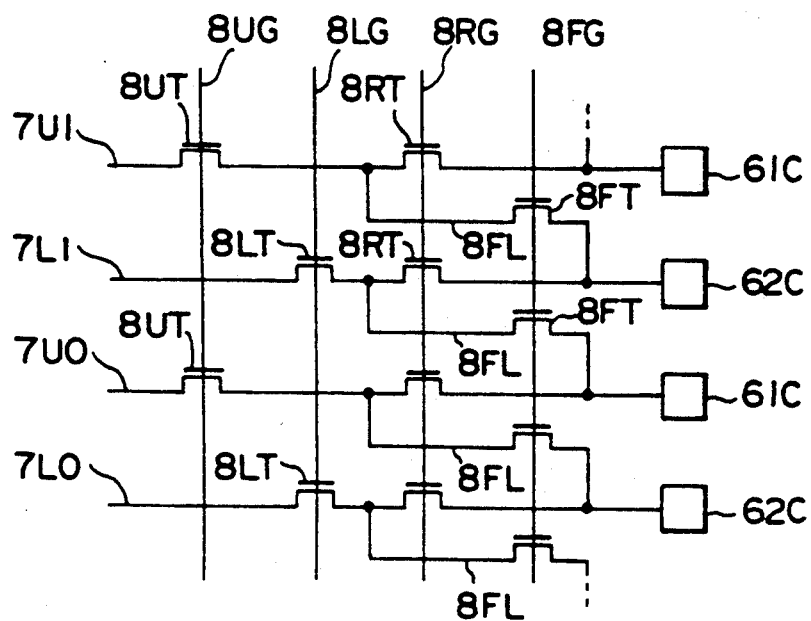
FIG. 7 is a circuit diagram showing the details of the transfer gate section of the first embodiment of this invention.

In addition, transfer gates 8 are inserted into the respective bit line groups 7U and 7L. Respective transfer gates 8 are arranged as shown in FIG. 7.

In this figure, reference numerals 7U1 and 7U0 represent bit lines constituting the bit line group 7U, and reference numerals 7L1 and 7L0 represent bit lines 7L. Here, only the bit lines 7U1, 7U0, 7L1 and 7L0 are shown. For facilitating understanding of the structure of this embodiment, it should be noted that a large number of bit lines exist as a matter of course in proportion to the memory capacity when a memory device is actually constituted.

Reference numeral 61C represents cells constituting the SAM register groups 61, and reference numeral 62C represents cells constituting the SAM register groups 62. Further, cells 61C are connected to bit lines 7U1 or 7U0, and cells 62C are connected to bit lines 7L1 or 7L0.

Reference numerals 8UT, 8LT, 8RT and 8FT represent transistors constituting the transfer gates 8. Transistors 8UT are inserted into the bit lines 7U1 and 7U0, and reference numeral 8UG represents an ON/OFF control line connected to the gates of the transistors 8UT. When data of the high order cell array of the RAM section is transferred, these transistors 8UT are brought into an ON state. In contrast, when data of the low order cell array is transferred, these transistors 8UT are brought into an OFF state.

Further, transistors 8LT are inserted into the bit lines 7L1 and 7L0, and reference numeral 8LG denotes an ON/OFF control line connected to the gates of the transistors 8LT. When data of the low order cell array of the RAM section is transferred, transistors 8LT are brought into an ON state. In contrast, when data of the high order cell array is transferred, transistors 8LT are brought into an OFF state.

Transistors 8RT are inserted between the transistors 8UT in the bit lines 7L1 and 7L0 and the cells 61C, and between the transistors 8LT and the cells 62C. Further, reference numeral 8RG represents an ON/OFF control line connected to the gates of the transistors 8RT. When data of the high order cell array of the RAM section is transferred to the cells 61C, and when data of the low order cell array is transferred to the cells 62C, the transistors 8RT are brought into an ON state. In contrast, when data of the high order cell array is transferred to the cells 62C, and when data of the low order cell array is transferred to the cells 61C, the transistors 8RT are brought into an OFF state.

Reference numeral 8FL represents the shift lines. These include: a shift line for connecting the junction transistors 8UT and 8RT on the bit line 7U1 to the junction of the transistor 8RT on the bit line 7L1 and the cell 62C, a shift line for connecting the junction of transistors 8LT and 8RT on the bit line 7L1 to the junction of the transistor 8RT on the bit line 7U0 and the cell 61C, a shift line for connecting the junction of the transistors 8UT and 8RT on the bit line 7U0 to the junction of the transistor 8RT on the bit line 7L0 and the cell 62C, and a shift line for connecting the junction of the transistors 8LT and 8RT on the bit line 7L0 to the junction of the transistor 8RT on the bit line 7U1 and the cell 61C.

Transistors 8FT are inserted into respective shift lines 8FL. When data on the bit line 7U1 is transferred to the cell 62C on the bit line 7L1, when data on the bit line 7L1 is transferred to the cell 61C on the bit line 7U0, when data on the bit line 7U0 is transferred to the cell 62C on the bit line 7L0, and when data on the bit line 7L0 is transferred to the cell 61C on the bit line 7U1, the transistors 8FT are brought into an ON state.

In the above-described configuration, by allowing the transistors 8UT and 8RT to be turned ON and allowing the transistors 8LT and 8FT to be turned OFF, only the bit lines 7U1 and 7U0 on the high order side become active. Thus, data transfer can be carried out from the high order cell array only to the cells 61C of the SAM register.

Then, by allowing the transistors 8LT and 8RT to be turned ON and allowing the transistors 8UT and 8FT to be turned OFF, only the bit lines 7L1 and 7L0 on the low order side become active. This results in the state where data transfer can be carried out from the low order cell array only to the cells 62C of the SAM register. Further, by allowing the transistors 8UT and 8FT to be turned ON, and allowing the transistors 8LT and 8RT to be turned OFF, the shift lines 8FT from the bit lines 7U1 and 7U0 on the high order side to the bit lines 7L1 and 7L0 on the low order side become active, resulting in the state where data transfer can be carried out from the high order cell array to the cells 62C of the SAM register.

Then, by allowing the transistors 8LT and 8FT to be turned ON and allowing the transistors 8UT and 8RT to be turned OFF, the shift lines 8FT from the bit lines 7L1 and 7L0 on the low order side to the bit lines 7U1 and 7U0 on the high order side become active, resulting in the state where data transfer can be carried out from the low order cell array to the cells 61C of the SAM register.

Accordingly, by alternately allowing both the first and second SAM registers to be in a standby state and in an operational state to carry out split transfer, continuous access from the SAM side to the RAM section can be made. In providing a continuous access to the RAM section, the data transfer from the high order cell array to the cells 61C of the SAM register and the data transfer from the low order cell array to the cells 62C of the SAM register can be carried out. Accordingly, it is clear that accesses to the high order cell array and the low order cell array can be interchangeably made. In addition the data transfer from the low order cell array to the cells 61C of the SAM register and the data transfer from the low order cell array to the cells 61 of the SAM register can be carried out. Thus, continuous access to the same cell array on the high order side or the low order side can also be provided.

Figures 3, 4, 5:
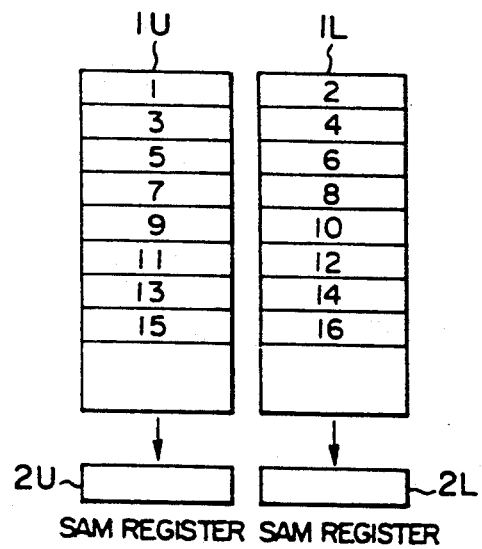
FIG. 3 is a conceptual diagram of a memory space of a DRAM having split SAM registers.
FIG. 4 is a conceptual diagram showing an example of mapping on a display image.
FIG. 5 is a conceptual diagram showing another example of mapping on a display image.

Thus, even with the abovementioned window control, based on the above-described mapping as shown in FIG. 5, the continuity of words can be maintained without the necessity of transferring to the SAM register the words AD 6 and AD 9. In accordance with this embodiment, the degree of freedom of mapping can be improved in a frame buffer.

Figure 8:
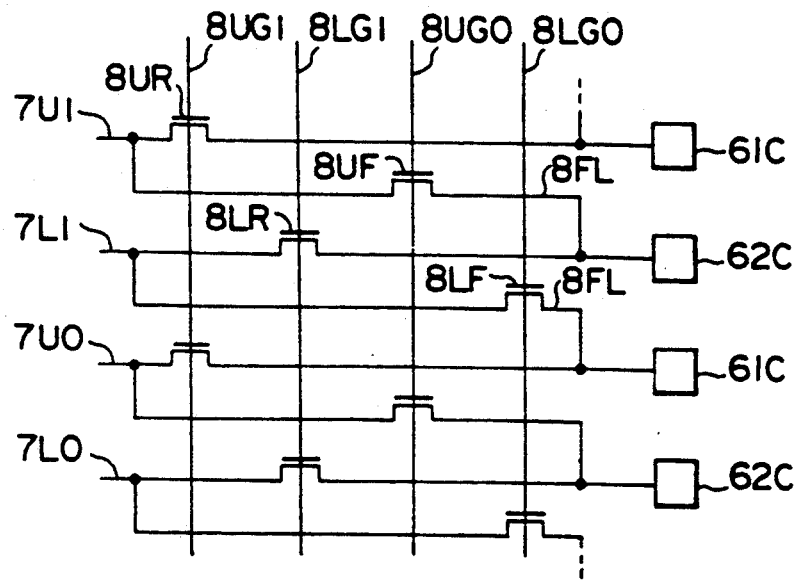
FIG. 8 is a circuit diagram of a second embodiment of this invention.

Referring to FIG. 8, there is shown a second embodiment of this invention.

The main feature of this embodiment is that one transistor 8UR has role of the both transistors 8UT and 8RT, that one transistor 8UF has the role of the transistors 8UT and 8FT, that one transistor 8LR has the role of transistors 8LT and 8RT, and that one transistor 8LF has the role of the both two transistors 8LT and 8FT.

Shift lines 8FL are provided in parallel with bit lines 7U1, 7L1, 7U0 and 7L0. Respective transistors 8UR are inserted into the bit lines 7U1 and 7U0, respective transistors 8LR are inserted into the bit lines 7L1 and 7L0, respective transistors 8UF are inserted into the shift line 8FL connecting bit lines 7U1 and 7L1 and into the shift lines 8FL connecting bit lines 7U0 and 7L0, and transistors 8LF are inserted into the shift line 8FL connecting bit lines 7U0 and 7L1 and into the shift line 8FL connecting bit lines 7U1 and 7L0.

In the above-described configuration, by respectively allowing the transistors 8UR and 8LF to be turned ON and OFF, only the bit lines 7U1 and 7U0 on the high order side become active, resulting in the state where data transfer can be carried out from the high order cell array only to the cells 61C of the SAM register.

Then, by respectively allowing the transistors 8LR and 8UF to be turned ON and OFF, only the bit lines 7L1 and 7L0 on the low order side become active, resulting in the state where data transfer can be carried from the low order cell array only to the cells 62C of the SAM register.

Further, by respectively allowing the transistors 8UF and 8LR to be turned ON and OFF, the shift lines 8FT from the bit lines 7U1 and 7U0 on the high order side to the bit lines 7L1 and 7L0 on the low order side become active, resulting in the state where data transfer can be carried out from the high order cell array to the cells 62C of the SAM register.

Then, by respectively allowing the transistors 8LF and 8UR to be turned ON and OFF, the shift lines 8FT from the bit lines 7L1 and 7L0 on the low order side to the bit lines 7U1 and 7U0 on the high order side become active, resulting in the state where data transfer can be carried out from the low order cell array to the cells 61C of the SAM register.

Accordingly, this embodiment not only exhibits the advantages similar to those of the above-described first embodiment, but also permits reduction of the number of transistors.

Figure 9:
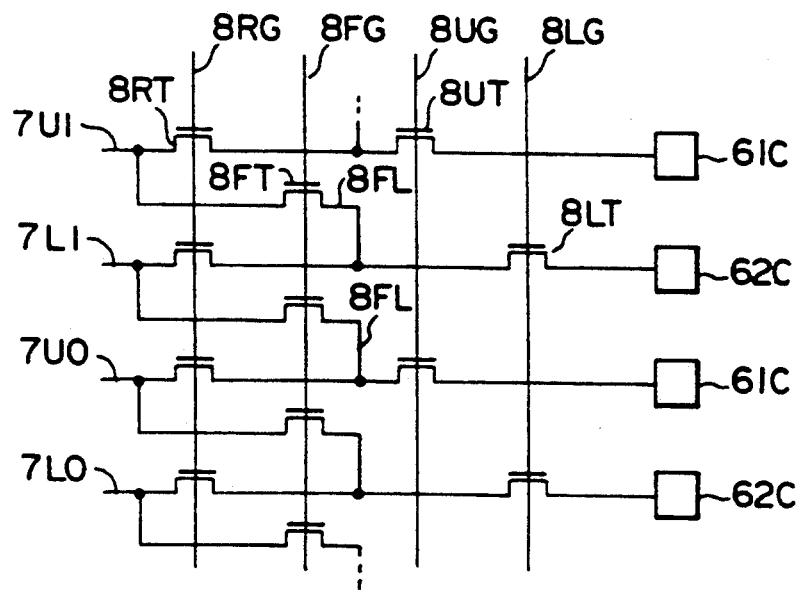
FIG. 9 is a circuit diagram of a third embodiment of this invention.

Referring to FIG. 9, there is shown a third embodiment of this invention. In the first embodiment shown in FIG. 7, the relationship in arrangement between the high order side/low order side selection transistors 8UT and 8LT of the RAM section and the transistors 8RT and 8FT for selecting whether or not data from the cell array is subjected to shift transfer is such that the former transistors are arranged closer to the RAM section and the latter transistors are arranged closer to the SAM section. On the contrary, this embodiment employs the relationship in arrangement opposite to the above. Namely, there is employed an arrangement such that transistors 8UT and 8LT are arranged closer to the SAM section and transistors 8RT and 8FT are arranged closer to the RAM section. Other components are the same as those of the first embodiment, and the effects and/or advantages exhibited is equivalent to the above.

Figure 10:
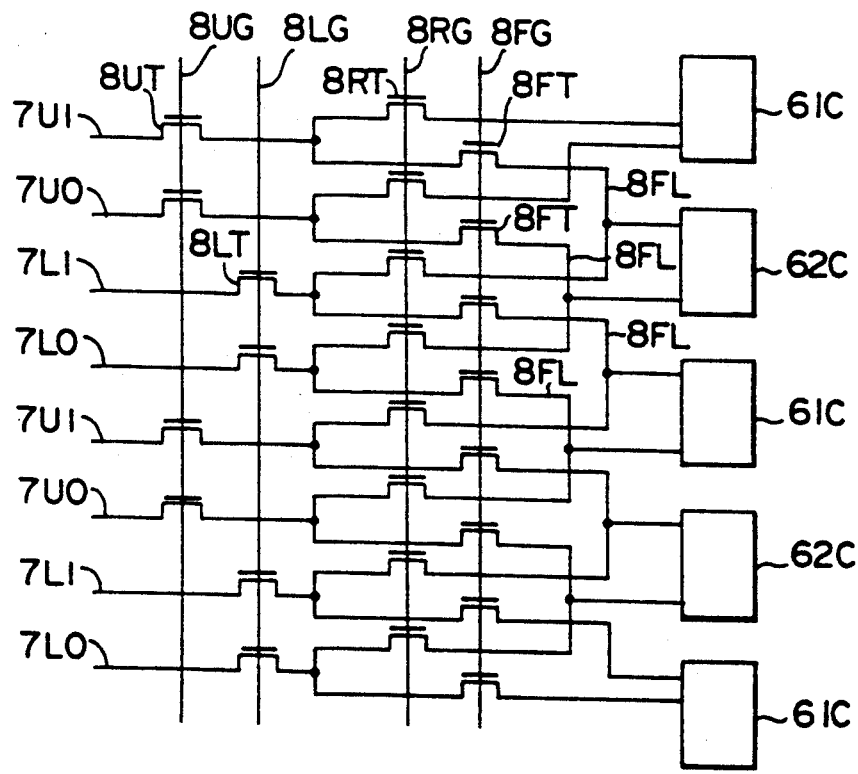
FIG. 10 is a circuit diagram of a fourth embodiment of this invention.

Referring to FIG. 10, there is shown a fourth embodiment of this invention.

In the previously described first to third embodiments, data transfer between the RAM section and the SAM section is carried out on every bit line, and shift operation is conducted similarly on every bit line.

In this embodiment, data transfer between the RAM section and the SAM section is carried out with a bit line pair as a unit. In correspondence with employment of such a data transfer system, a shift operation in transferring is also carried out also with a bit line pair as a unit. Other components are the same as those of the first embodiment, and the advantages exhibited are equivalent to the above.

Figure 11:
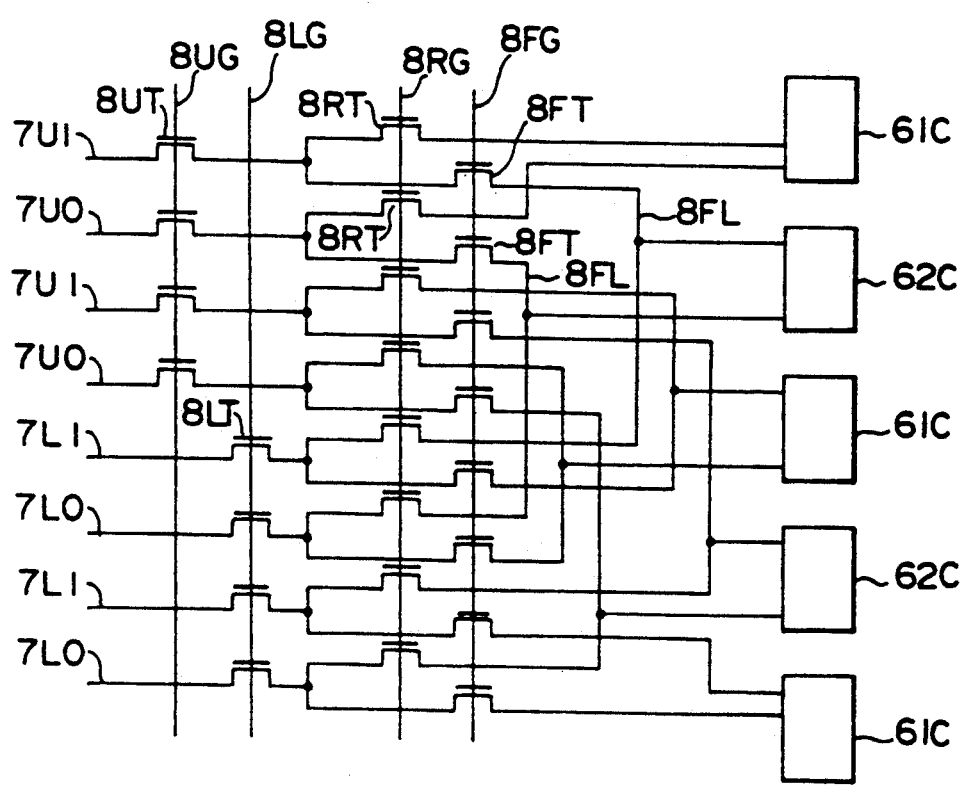
FIG. 11 is a circuit diagram of a fifth embodiment of this invention.

Finally, referring to FIG. 11, there is shown a fifth embodiment of this invention.

In this embodiment, in the same manner as in the fourth embodiment, data transfer between the RAM section and the SAM section is carried out with a bit line pair as a unit, and a shift operation in transfer is also carried out with a bit line pair as a unit. While decoding of the MSB of the column address is carried out every column in the previously described fourth embodiment, such a decoding is carried out every two columns in this embodiment. Other components are the same as those of the fourth embodiment, and the advantages exhibited are equivalent to the above.

As described above, in accordance with this invention, by controlling the first to fourth transfer gates, data transfer to the register on the standby side of the first and second registers constituting the SAM section can be carried out at all times irrespective of the value of a specific bit of the column address. As a result, continuous access by the split transfer within the same cell array can be carried out. Thus, the degree of freedom of mapping can be improved in a frame buffer.

What is claimed is:

1. A semiconductor memory device comprising:
    a RAM section in which the memory area is halved into a first cell array and a second cell array by the value of a specific bit constituting a portion of a column address,
    a SAM section comprised of first and second registers,
    a first data transfer path for carrying out data transfer from said first cell array to said first register,
    a first transfer control means inserted into said first data transfer path,
    a second data transfer path for carrying out data transfer from said second cell array to said second register,
    a second transfer control means inserted into said second data transfer path,
    a third data transfer path for shifting data from said first cell array to said second data transfer path,
    a third transfer control means inserted into said third data transfer path,
    a fourth data transfer path for shifting data from said second cell array to said first data transfer path, and
    a fourth transfer control means inserted into said fourth data transfer path.

2. The semiconductor memory device as claimed in claim 1, wherein said first transfer control means comprises serially connected first and second transfer gates, said second transfer control means comprises third transfer gates, said third transfer control means comprises serially connected fourth and fifth transfer. gates, and said fourth transfer control means comprises a sixth transfer gate,
    said third transfer gate being connected across a connection node between said first and second transfer gates, and connection node between said fifth transfer gate and said second register, and
    said sixth transfer gate being connected across a connection node between said fourth and fifth transfer gates, and connection node between said second transfer gate and said first register.

3. The semiconductor memory device as claimed in claim 1, wherein said first, second, third and fourth transfer control means comprise first, second, third and fourth transfer gates, respectively,
    said second transfer control means being connected across a connection node between said first cell array and said first transfer gate, and connection node between said third transfer gate and said second register, and
    said fourth transfer control means being connected across a connection node between said third transfer gate and said second cell array, and a connection node between said first transfer gate and said first register.

4. The semiconductor memory device as claimed in claim 1, wherein said first transfer control means comprises serially connected first and second transfer gates, said second transfer control means comprises third transfer gates, said third transfer control means comprises serially connected fourth and fifth transfer gates, said fourth transfer control means comprises a sixth transfer gate,
    said third transfer gate being connected across a connection node between said first transfer gate and said first cell array, and a connection node between said fourth and fifth transfer gates, and
    said sixth transfer gate being connected across a connection node between said fourth transfer gate and said first cell array, and a connection node between said first and second transfer gates.

5. The semiconductor memory device as claimed in claim 2, wherein said first and fourth transfer gates of a bit line pair are commonly connected to a first and second control line alternately, said second and fifth transfer gates of all bit line pairs are commonly connected to a third control line and said third and sixth transfer gates of all bit line pairs are commonly connected to a fourth control line.

6. The semiconductor memory device as claimed in claim 2, wherein said first and fourth transfer gates of two bit line pairs are commonly connected to a first and second control line alternately, said second and fifth transfer gates of all bit line pairs are commonly connected to a third control line and said third and sixth transfer gates of all bit line pairs are commonly connected to a fourth control line.

* * * * *